United States Patent [19]

Fujii

[11] Patent Number: 5,652,183

[45] Date of Patent: Jul. 29, 1997

[54] METHOD FOR FABRICATING SEMICONDUCTOR DEVICE CONTAINING EXCESSIVE SILICON IN METAL SILICIDE FILM

[75] Inventor: Toyokazu Fujii, Nara, Japan

[73] Assignee: Matsushita Electric Industrial Co., Ltd., Kadoma, Japan

[21] Appl. No.: 368,604

[22] Filed: Jan. 4, 1995

[30] Foreign Application Priority Data

Jan. 18, 1994 [JP] Japan ................. 6-003464

[51] Int. Cl.$^6$ ................................ H01L 21/283
[52] U.S. Cl. ................. 437/200; 437/41 GS; 437/57; 437/193
[58] Field of Search ............. 437/41 GS, 41 SM, 437/200, 193, 56, 57; 257/377

[56] References Cited

U.S. PATENT DOCUMENTS

| | | | |
|---|---|---|---|
| 4,443,930 | 4/1984 | Hwang et al. | 437/41 GS |
| 4,640,004 | 2/1987 | Thomas et al. | 437/190 |
| 4,782,033 | 11/1988 | Gierisch et al. | 437/56 |
| 4,786,611 | 11/1988 | Pfiester | 437/45 |
| 4,912,542 | 3/1990 | Suguro. | |
| 4,920,071 | 4/1990 | Thomas | 437/188 |
| 5,100,811 | 3/1992 | Winnerl et al. | 437/31 |
| 5,162,884 | 11/1992 | Lion et al. | 257/384 |
| 5,190,886 | 3/1993 | Asahina | 437/41 SM |
| 5,268,590 | 12/1993 | Pfiester et al. | 257/764 |
| 5,341,014 | 8/1994 | Fujii et al. | 257/377 |
| 5,355,010 | 10/1994 | Fujii et al. | 257/377 |
| 5,459,101 | 10/1995 | Fujii et al. | 437/200 |

FOREIGN PATENT DOCUMENTS

| | | |
|---|---|---|
| 57-192079 | 11/1982 | Japan. |
| 1-265542 | 10/1989 | Japan. |
| 2-192161 | 7/1990 | Japan. |
| 2-222149 | 9/1990 | Japan. |
| 3-41762 | 2/1991 | Japan. |
| 5-183117 | 7/1993 | Japan. |
| 6-45544 | 2/1994 | Japan. |

OTHER PUBLICATIONS

C.L. Chu et al., "Technology Limitations for $N^{30}/P^{30}$ Polycide Gate CMOS due to Lateral Dopant Diffusion in Silicide/Polysilicon Layers", *IEEE Electron Device Letters*, vol. 12, No. 12, Dec. 1991.

T. Fujii et al., "Dual ($n^{30}/p^{30}$) Polycide Gate Technology using Si-rich WSix to Exterminate Lateral Dopant Diffusion", *1994 Symposium on VLSI Technology Digest of Technical Papers*, pp. 117–118, 7–9 Jun. 1994.

L. C. Parrillo et al., "A Fine–Line CMOS Technology That Uses $P^{30}$ –Polysilicon/Silicide Gates for NMOS and PMOS Devices", *IEEE IEDM Technical Digests*, pp. 418–422, Dec. 1984.

*Primary Examiner*—T. N. Quach
*Attorney, Agent, or Firm*—Ratner & Prestia

[57] ABSTRACT

A method for fabricating a semiconductor device which includes a metal silicide film for electrically connecting a first silicon region containing a p-type impurity with a second silicon region containing an n-type impurity is disclosed. The method includes the step of depositing the metal silicide film so as to contain excessive silicon. Such excessive silicon is precipitated in silicide grain boundaries in the metal silicide film and thus makes a diffusion path of impurities along the silicide grain boundaries discontinuous.

15 Claims, 9 Drawing Sheets

METHOD FOR FABRICATING SEMICONDUCTOR DEVICE CONTAINING EXCESSIVE SILICON IN METAL SILICIDE FILM

BACKGROUND OF THE INVENTION

1. Field of the Invention

The present invention relates to a semiconductor device, in which silicon or polysilicon including a p-type impurity and silicon or polysilicon including an n-type impurity are electrically connected with each other using a metal silicide film, and a method for fabricating the same.

2. Description of the Related Art

In recent years, it has been known that, in order to reduce the size of an MOS transistor, it is advantageous to use $p^+$-type polysilicon for a gate electrode of a p-channel MOS transistor and $n^+$-type polysilicon for a gate electrode of an n-channel MOS transistor. The advantages achieved by this technique is described, for example, in IEEE, IEDM, Technical Digest, pp. 418–422 (1984). Also, in general a $p^+$-type polysilicon film is used to form a contact between a polysilicon film and a $p^+$-type region formed in a semiconductor substrate, and an $n^+$-type polysilicon film is used to form a contact between a polysilicon film and an $n^+$-type region formed in the semiconductor substrate.

In view of the above points, in forming a CMOS semiconductor device in which both p-channel and n-channel MOS transistors are formed on one semiconductor substrate, it is advantageous to form both $p^+$-type regions and $n^+$-type regions in one polysilicon layer in a mixed condition, in order to reduce the size of an integrated circuit device as well as other purposes.

The polysilicon layer has a high specific resistance compared with a general metal film. For this reason, it is a general practice to deposit on the polysilicon layer a refractory metal silicide film, a nitride film of a refractory metal, or the like, so as to form a polycide film including two-layers. Furthermore, after forming the polycide film including the two-layer structure of the polysilicon film and the metal silicide film, the polycide film can be subjected to heat treatment at 900° C. so as to be planarized using a BPSG film (boron and phosphorus contained silicate glass). This type of semiconductor device is disclosed, for example, in Japanese Laid-Open Patent Publication No. 57-192079. Moreover, in this two-layer polycide film, the $p^+$-polysilicon film and the $n^+$-polysilicon film can electrically communicate with each other through the refractory metal silicide film, the nitride film of the refractory metal, or the like, thereby eliminating the necessity of formation of an additional contact area for the connection therebetween.

However, in the case of the polycide film formed by simply depositing the metal silicide film on the polysilicon film; when it is subjected to heat treatment in a post-process such as the planarization using the BPSG film, boron, which is a typical p-type impurity contained in the $p^+$-polysilicon film, and phosphorus or arsenic, which are typical n-type impurities contained in the $n^+$-type region, diffuse into the metal silicide film and become mixed with each other. This causes, when the polycide film is used for a gate electrode of a MOSFET, deviation in the threshold voltage (Vt) of the MOSFET. This deviation of the threshold voltage generally occurs for a p-channel MOSFET, and not for an n-channel MOSFET. This problem is described, for example, in IEEE, Electron Device Letter, Vol. 12, pp. 696–698 (1991).

This problem will be described with reference to FIGS. 10A and 10B. FIGS. 10A and 10B schematically illustrate the configuration of a semiconductor device 900 in which an n-type MOSFET 102a and a p-type MOSFET 102b are formed in a semiconductor substrate 190 with isolation regions 101 therebetween. FIG. 10B is a cross-sectional view taken along a line 10B—10B' in FIG. 10A.

As shown in FIGS. 10A and 10B, the n-type MOSFET 102a includes a source 103a and a drain 104a, and the p-type MOSFET 102b includes a source 103b and a drain 104b. A polycide gate 105a containing an n-type impurity such as arsenic (As) and a polycide gate 105b containing a p-type impurity such as boron (B) are provided for the n-type MOSFET 102a and the p-type MOSFET 102b, respectively.

Each of the polycide gates 105a and 105b is formed by laminating a tungsten silicide film 107 on a polysilicon film of a lower layer. A polysilicon film of the polycide gate 105a on the n-type MOSFET 102a is doped with an n-type impurity to form an $n^+$-type polysilicon film 106a. In the same manner, a polysilicon film of the polycide gate 105b on the p-type MOSFET 102b is doped with a p-type impurity to form a $p^+$-type polysilicon film 106b. Hereinafter, the reference numeral 106 is used for collectively referring to both the $n^+$-polysilicon film 106a and the $p^+$-type polysilicon film 106b.

When the semiconductor device 900 having the polycide structure including the tungsten silicide film 107 laminated on the polysilicon film 106 of the lower layer is subjected to heat treatment, arsenic, which is the n-type impurity in the $n^+$-type polysilicon film 106a, diffuses into the $p^+$-type polysilicon film 106b in the gate 105b of the p-type MOSFET 102b, as shown in FIG. 10B. In the same manner, boron, which is the p-type impurity in the $p^+$-type polysilicon film 106b, diffuses into the $n^+$-type polysilicon film 106a in the gate 105a of the n-type MOSFET 102a. The diffusion of such impurities leads to change in a work function of the gate electrodes of the semiconductor device 900, thereby deviating the threshold voltage (Vt).

In the same manner, if an interconnection connected to the gate 103a and the drain 104a which are $n^+$-type diffused regions and to the gate 103b and the drain 104b which are $p^+$-type diffused regions is formed by using the above polycide structure, the contact resistance deviates.

In order to prevent lateral diffusion of the impurities through the metal silicide film as described above, a semiconductor device including a diffusion barrier film between the polysilicon film and the metal silicide film, and a method for fabricating the same, have been disclosed, for example, in Japanese Laid-Open Patent Publication Nos. 1-265542 and No. 2-192161.

However, the methods disclosed in the above references for forming the polycide film with the diffusion barrier film lengthens the fabrication process and raises the cost thereof. Furthermore, the effect of a TiN film as the diffusion barrier film is not stable because it depends greatly upon fabrication parameters such as the composition ratio of N/Ti, the amount of oxygen contained as an impurity, the grain size, and the crystal orientation. In particular, when the polycide film is used for interconnections, the thickness of the TiN film is reduced at the contact areas, and thus the effect of the diffusion barrier may be lost. Consequently, p-type impurities or n-type impurities contained in the polysilicon film diffuse into the metal silicide layer, and further diffuse through the metal silicide film. With this diffusion, the p-type impurities reach the $n^+$-type polysilicon film and the n-type impurities reach the $p^+$-type polysilicon film. As a result, the carrier concentration is lowered due to the compensation effect, which is in turn causes the problem of deviated contact resistance.

SUMMARY OF THE INVENTION

The semiconductor device of this invention includes: a first silicon region containing a p-type impurity; a second silicon region containing an n-type impurity; and a metal silicide film for electrically connecting the first silicon region with the second silicon region, wherein the metal silicide film contains excessive silicon, the excessive silicon being precipitated in silicide grain boundaries in the metal silicide film, thereby making a diffusion path of impurities along the silicide grain boundaries discontinuous.

According to another aspect of the invention, a method for fabricating a semiconductor device, including a metal silicide film for electrically connecting a first silicon region containing a p-type impurity with a second silicon region containing an n-type impurity, includes the step of depositing the metal silicide film so as to contain excessive silicon, wherein the excessive silicon is precipitated in silicide grain boundaries in the metal silicide film, thereby making a diffusion path of impurities along the silicide grain boundaries discontinuous.

In one embodiment, the metal silicide film is a tungsten silicide film, the tungsten silicide film having a ratio of silicon atoms to tungsten atoms (Si/W) within a range of 2.36 to 4.0. Preferably, the ratio of silicon atoms to tungsten atoms (Si/W) is within a range of 2.36 to 3.0.

In one embodiment, the first silicon region is a first polysilicon film doped with the p-type impurity in a p-type polycide gate electrode of a p-channel MOS transistor, the second silicon region is a second polysilicon film doped with the n-type impurity in an n-type polycide gate of an n-channel MOS transistor, and the metal silicide film is deposited on the first and second polysilicon films so as to electrically connect the first and second polysilicon films. Preferably, the excessive silicon is sufficiently excessive to keep a threshold voltage deviation in the p-type and n-type polycide gate electrodes at a predetermined value or less. More preferably, the threshold voltage deviation is suppressed within 20 mV. Alternatively, the threshold voltage deviation is suppressed within 10% of a design value.

In another embodiment, the first silicon region is a first polysilicon film doped with the p-type impurity being in contact with a $p^+$-type diffusion region doped with the p-type impurity of the p-channel MOS transistor, the second silicon region is a second polysilicon film doped with the n-type impurity being in contact with an $n^+$-type diffusion region doped with the n-type impurity of the n-channel MOS transistor, and the metal silicide film is deposited on the first and second polysilicon films so as to electrically connect the first and second polysilicon films. Preferably, the excessive silicon is sufficiently excessive to keep a contact resistance deviation between the $p^+$-type diffusion region and the first polysilicon region and between the $n^+$-type diffusion region and the second polysilicon film at a predetermined value or less. More preferably, the contact resistance deviation is suppressed within 20% of a design value.

In still another embodiment, a third silicon film for preventing segregation of boron is further deposited on the metal silicide film.

In still another embodiment, boron is uniformly contained in the entire metal silicide film.

In one embodiment, the step of depositing the metal silicide film employs a chemical vapor deposition method. In another embodiment, the step of depositing the metal silicide film employs a sputtering method.

In still another embodiment, the step of depositing the metal silicide film employs a chemical vapor deposition method, and the metal silicide film and the first and second polysilicon films are successively deposited in the same vacuum chamber.

In still another embodiment, a third polysilicon film for preventing segregation of boron is further deposited on the metal silicide film, wherein the step of depositing the metal silicide film employs a chemical vapor deposition method, and the metal silicide film and the first, second and third polysilicon films are successively deposited in the same vacuum chamber.

According to the present invention, excessive silicon contained in a metal silicide film is precipitated in silicide grain boundaries of the metal silicide film, thereby breaking continuous interfaces between $WSi_2$ grains in the silicide grain boundaries along which impurities diffuse. As a result, the impurities do not laterally diffuse in the metal silicide film even after thermal treatment at about 900° C. for planarization is performed using a BPSG film and the like.

In the case where the metal silicide film is a tungsten silicide film, with the ratio of silicon atoms to tungsten atoms (Si/W) within the ranges described in claim 2 and further in claim 3, the above effect can be obtained without being affected by the increase in the specific resistance of the metal silicide film due to excessive silicon.

The present invention is applicable to a polycide gate of a channel-type MOS transistor or a polycide interconnection thereof. The excessive silicon grains which are contained in the metal silicide film are sufficient to keep the threshold voltage deviation for the application to the polycide gate electrode, or the contact resistance deviation for the application to the polycide interconnection, at a predetermined value or less.

By depositing another polysilicon film on the metal silicide film for preventing segregation of boron, or by having the entire metal silicide film uniformly doped with boron, the lateral diffusion of impurities can be further suppressed.

For the deposition of the metal silicide film, a chemical vapor deposition method or a sputtering method, which are generally employed methods in semiconductor technology, can be used. In the case where the chemical vapor deposition method is used in particular, the fabrication process can be prevented from being complicated by successively depositing the metal silicide film and the polysilicon film in the same vacuum chamber.

Thus, the invention described herein makes possible the advantages of (1) providing a semiconductor device having the configuration in which silicon or polysilicon containing a p-type impurity and silicon or polysilicon containing an n-type impurity are electrically connected with each other by using metal silicide so as to prevent the impurity from diffusing in the metal silicide film even after heat treatment in post-process, and (2) providing a method for fabricating the same.

These and other advantages of the present invention will become apparent to those skilled in the art upon reading and understanding the following detailed description with reference to the accompanying figures.

BRIEF DESCRIPTION OF THE DRAWINGS

FIG. 10B being a cross-sectional view taken along a line 10B—10B' of FIG. 10A.

DESCRIPTION OF THE PREFERRED EMBODIMENTS

Hereinafter, the present invention will be described by way of examples with reference to the accompanying drawings.

EXAMPLE 1

Figure 1:
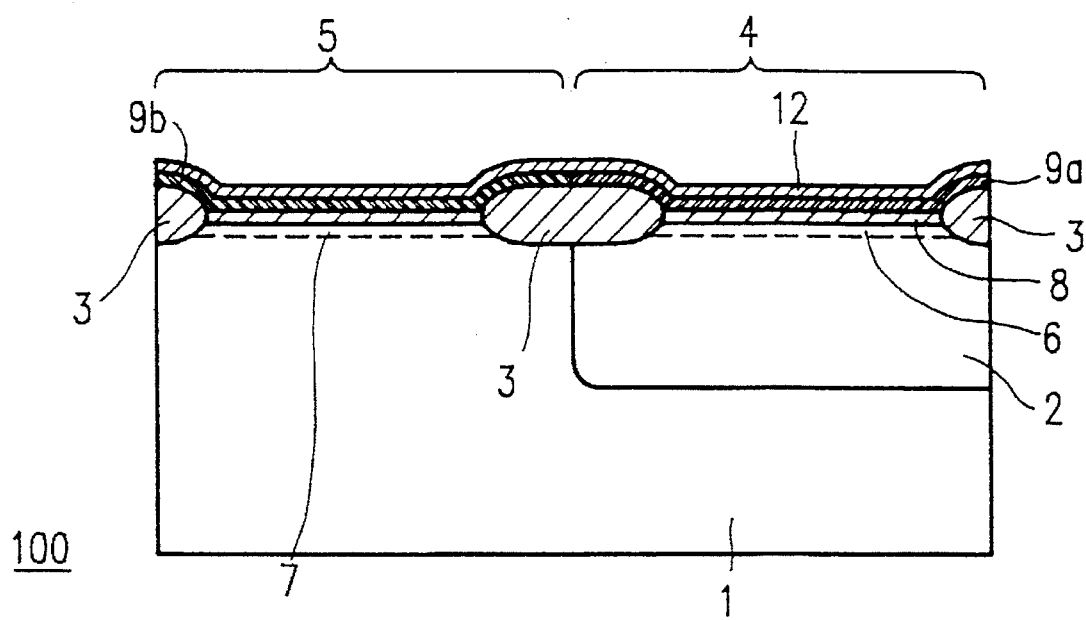
FIG. 1 is a cross-sectional structural view of a main portion of a semiconductor device of a first example according to the present invention.

As a first example of the present invention, a semiconductor device 100 using a two-layer polycide film, which includes a polysilicon film and a metal silicide film, for a gate electrode as a polycide gate will be described with reference to the figures. FIG. 1 is a cross-sectional structural view of a main portion of the semiconductor device 100 of the first example.

The semiconductor device 100 includes a p-type silicon substrate 1, an n-type well 2 formed in the p-type silicon substrate 1, isolation regions 3 formed on the surface of the substrate 1 at predetermined intervals, a p-channel MOS transistor area 4 formed in the n-type well region 2, an n-channel MOS transistor area 5 formed in the region of the p-type substrate 1 except the n-type well 2. In the p-channel MOS transistor area 4, a $p^+$-type diffusion region 6 which is to be a source/drain region of the p-channel MOS transistor is provided in the vicinity of the surface of the substrate 1. In the same manner, in the n-channel MOS transistor area 5, an $n^+$-type diffusion region 7 which is to be a source/drain region of the n-channel MOS transistor is provided in the vicinity of the surface of the substrate 1.

Furthermore, a gate oxide film 8 is provided on the surface of the substrate 1, and a $p^+$-type polysilicon film 9a or an $n^+$-type polysilicon film 9b is provided thereon. A tungsten silicide film 12 is formed on the $p^+$-type polysilicon film 9a and the $n^+$-type polysilicon film 9b. The polysilicon film 9a or 9b and the tungsten silicide film 12 form a polycide film. The $p^+$-type diffusion region 6 and the $n^+$-type diffusion layer 7 shown in FIG. 1 are not formed directly under gate electrodes (not shown).

The method for fabricating the above semiconductor device 100 of FIG. 1 will be described with reference to FIGS. 2A to 2D, 3A to 3D, and 4A to 4D. FIGS. 2A to 2D are cross-sectional views of the semiconductor device 100 showing the same section of FIG. 1 at the respective steps of the fabrication method. FIGS. 3A to 3d are cross-sectional views of the semiconductor device 100 in the direction perpendicular to the paper face of FIGS. 2A to 2D in the n-channel MOS transistor area 5 at the respective steps shown in FIGS. 2A to 2D. In the same manner, FIGS. 4A to 4D are cross-sectional views of the semiconductor device 100 in the direction perpendicular to the paper face of FIGS. 2A to 2D in the p-channel MOS transistor area 4 at the respective steps shown in FIGS. 2A to 2D.

Figure 2A:
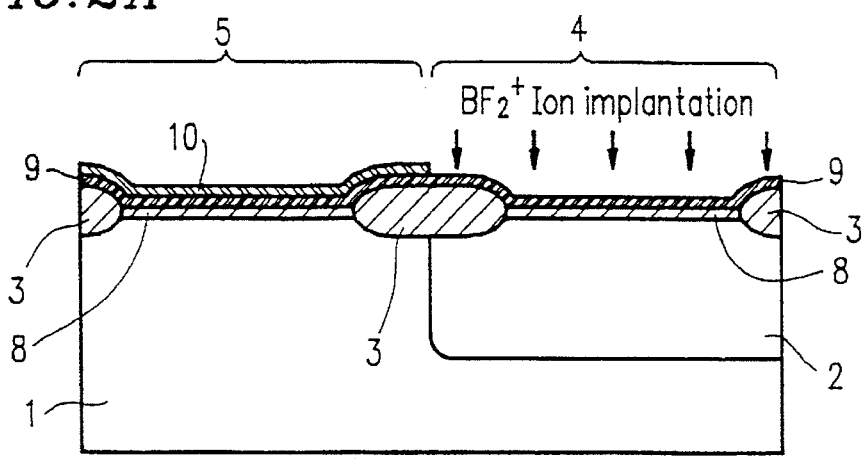
FIGS. 2A to 2D are cross-sectional structural views of the semiconductor device of the first example according to the present invention, at the respective steps of the fabrication method.
Figure 3A:
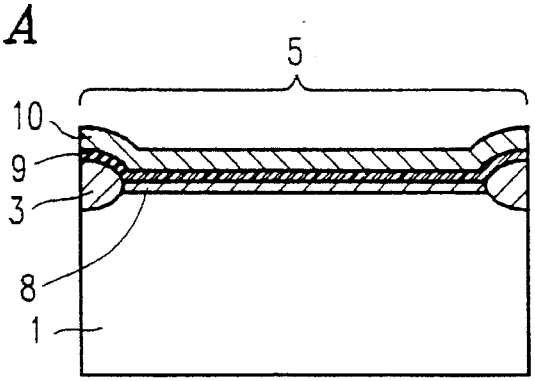
FIGS. 3A to 3D are cross-sectional structural views of the semiconductor device of the first example according to the present invention taken along another line, at the respective steps of the fabrication method.
Figure 4A:
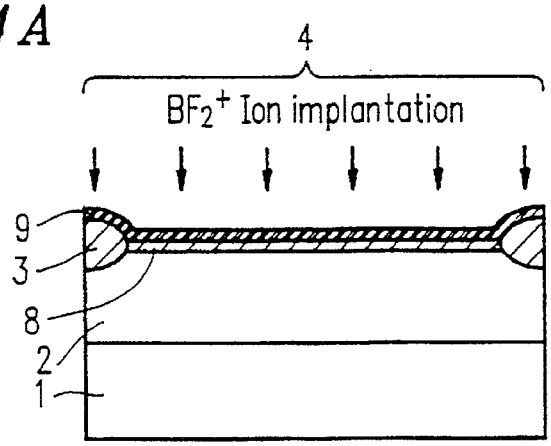
FIGS. 4A to 4D are cross-sectional structural views of the semiconductor device of the first example according to the present invention taken along still another line, at the respective steps of the fabrication method.

At the step shown in FIGS. 2A, 3A and 4A, the n-type well 2 is formed in the p-type silicon substrate 1 having a (100) orientation by an ion implantation method and a thermal diffusion method. The isolation regions 3 are then formed on the substrate 1 by a typical selective oxidation method. As described below, the n-type well 2 corresponds to the p-channel MOS transistor area 4, and the region other than the n-type well 2 corresponds to the n-channel MOS transistor area 5.

Thereafter, the gate oxide film 8 with a thickness of 10 nm is formed on the substrate 1, and a polysilicon film 9 is deposited on the gate oxide film 8. Then, the n-channel MOS transistor area 5 is covered with a photoresist 10, and $BF_2^+$ ions are implanted into the polysilicon film 9 at a dose of $6\times10^{15}$ cm$^{-2}$ at an accelerating energy of 10 KeV, so as to form the $p^+$-type polysilicon film 9a of the p-channel MOS transistor area 4.

Figure 2B:
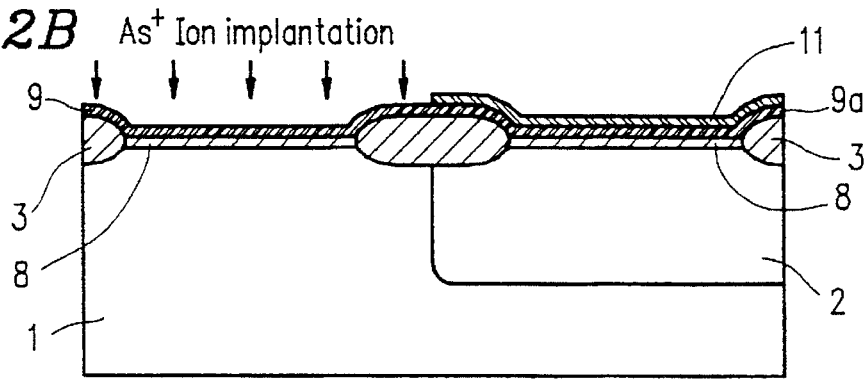
Figure 3B:
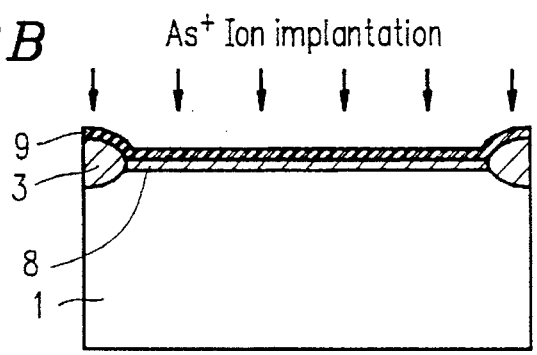
Figure 4B:
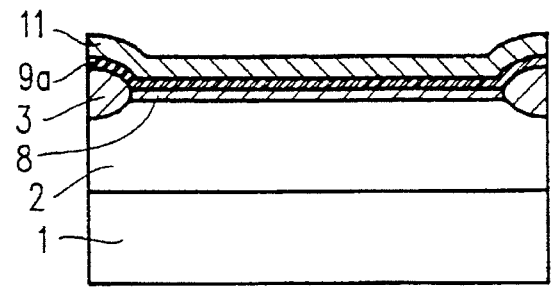

At the step shown in FIGS. 2B, 3B and 4B, after the removal of the photoresist 10, the p-channel MOS transistor area 4 is covered with another photoresist 11. Thereafter, $As^+$ ions are implanted into the polysilicon film 9 at a dose of $1\times10^{15}$ cm$^{-2}$ at an accelerating energy of 20 KeV, so as to form the $n^+$-type polysilicon film 9b of the n-channel MOS transistor region 5.

Figure 2C:
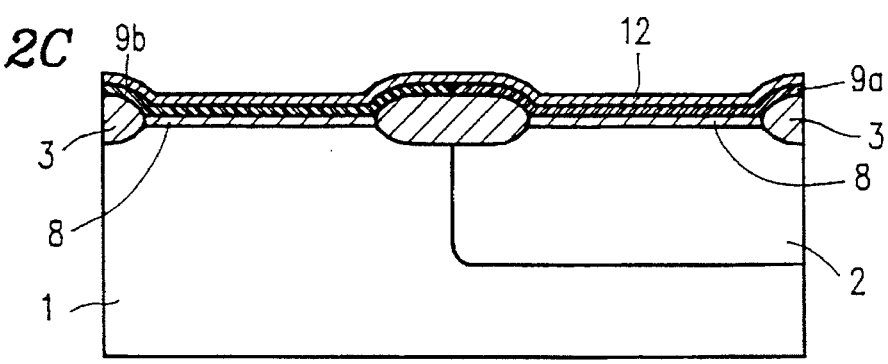
Figure 3C:
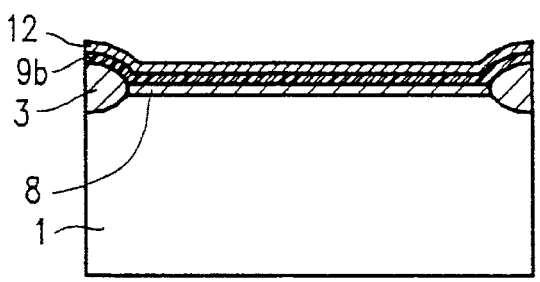
Figure 4C:
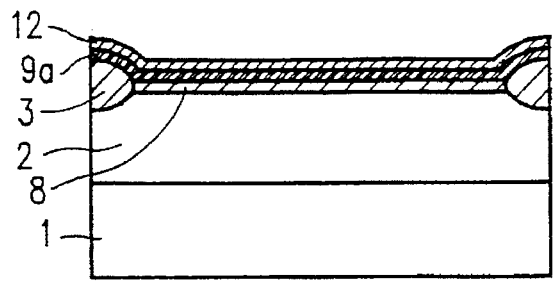

At the step shown in FIGS. 2C, 3C and 4C, after the removal of the photoresist 11, a native oxide film (not shown) formed on the surfaces of the polysilicon films 9a and 9b is removed by, for example, hydrofluoric acid treatment. The native oxide film is normally removed so as to prevent the tungsten silicide film 12 from being peeled. In other words, although having an advantage of low resistance, the tungsten silicide film containing silicon at a low concentration has a disadvantage in that it can be easily peeled because of its high stress. However, with the step for removing the native oxide film on the polysilicon as described above, such a peeling of the tungsten silicide film is prevented. As a result, the tungsten silicide film containing silicon at a low concentration, which can realize a low resistance, has been put into practice.

Following the hydrofluoric acid treatment, the tungsten silicide film 12 having a thickness of 200 nm is deposited on the polysilicon films 9a and 9b in such a manner that the ratio of the number of silicon atoms to that of tungsten atoms (Si/W) becomes 2.64 or more during the deposition. The tungsten silicide film 12 can be deposited by a sputtering method or a chemical vapor deposition method, as long as the rate of the number of atoms (Si/W) is 2.64 or more. The ratio (Si/W) decreases since silicon grains are precipitated by the heat treatment (for example, for 30 minutes at 900° C.) after the deposition. Therefore, the ratio of the numbers of silicon atoms to tungsten atoms (Si/W) in the tungsten silicide film 12 after the heat treatment becomes 2.36 or more.

Figure 2D:
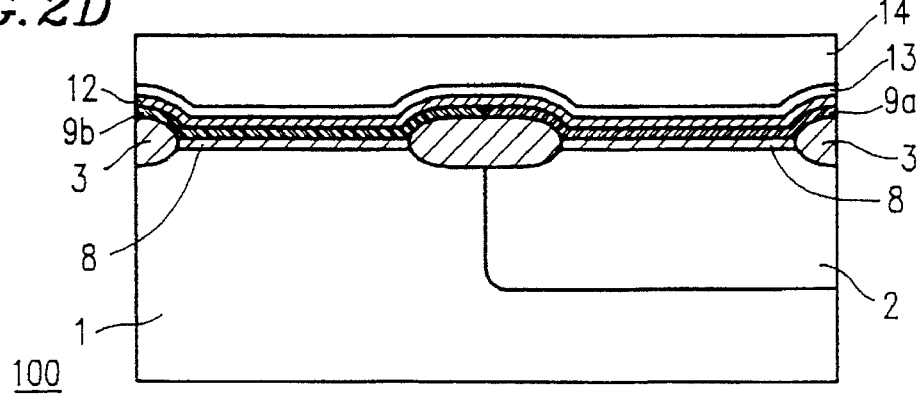
Figure 3D:
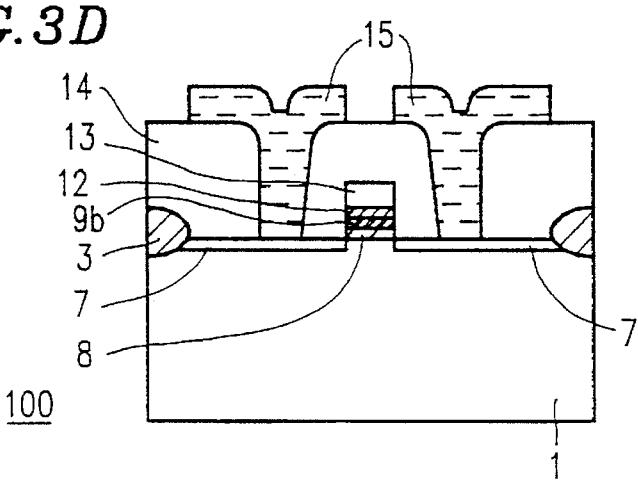
Figure 4D:
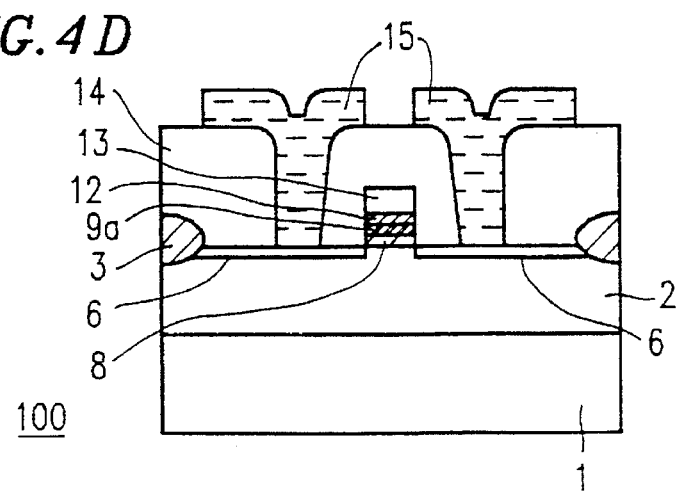

At the step shown in FIGS. 2D, 3D and 4D, a silicon oxide film 13 having a thickness of 200 nm is formed on the entire surface of the semiconductor device 100. Subsequently, the $p^+$-type polysilicon film 9a, the $n^+$-type polysilicon film 9b, the tungsten silicide film 12 and the silicon oxide film 13 are etched so that desired patterns of electrodes and interconnections can be obtained. In this etching process, not only a pattern of gate electrodes but also a pattern of interconnections between the gate electrode of the p-channel MOS transistor 4 and the gate electrode of the n-channel MOS transistor 5 can be formed simultaneously.

Then, $BF_2^+$ ions are implanted into the p-channel MOS transistor area 4 at a dose of $6 \times 10^{15}$ cm$^{-2}$ at an accelerating energy of 30 KeV, so as to form the $p^+$-type diffusion regions 6 (not shown in FIG. 2D) as the source/drain regions. On the other hand, $As^+$ ions are implanted into the n-channel MOS transistor region 5 at a dose of $6 \times 10^{15}$ cm$^{-2}$ at an accelerating energy of 40 KeV, so as to form the $n^+$-type diffusion regions 7 (not shown in FIG. 2D) as the source/drain regions.

Furthermore, an insulating film 14 is formed on the surface of the silicon oxide film 13. The heat treatment for activating impurities and planarizing the insulating film 14 is performed at 900° C. for 30 minutes in nitride atmosphere. Then, an interconnection 15 (not shown in FIG. 2D) of aluminum alloy, for example, is formed so as to contact the source, drain, and gate electrodes by known methods, thereby completing the semiconductor device 100.

Next, grain boundaries present in the metal silicide film formed in the above manner according to the present invention will be described.

Figure 5A:
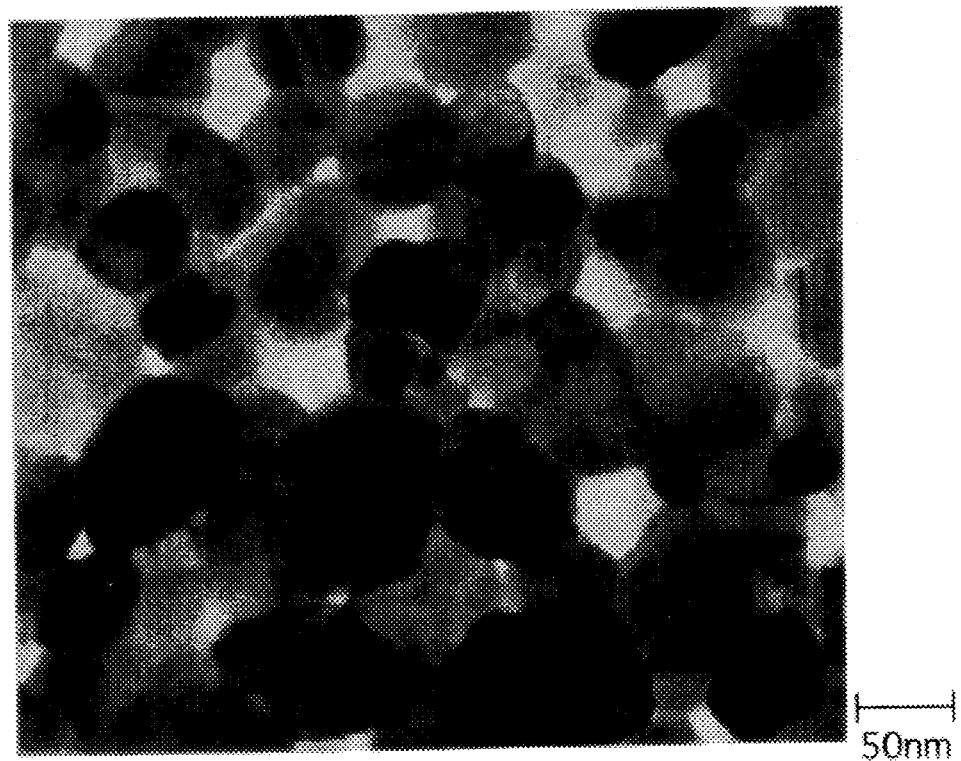
FIG. 5A is a photograph taken by a transmission electron microscope showing grains of a conventional tungsten silicide film with the ratio of atoms (Si/W) of 2.53 during deposition.
Figure 5B:
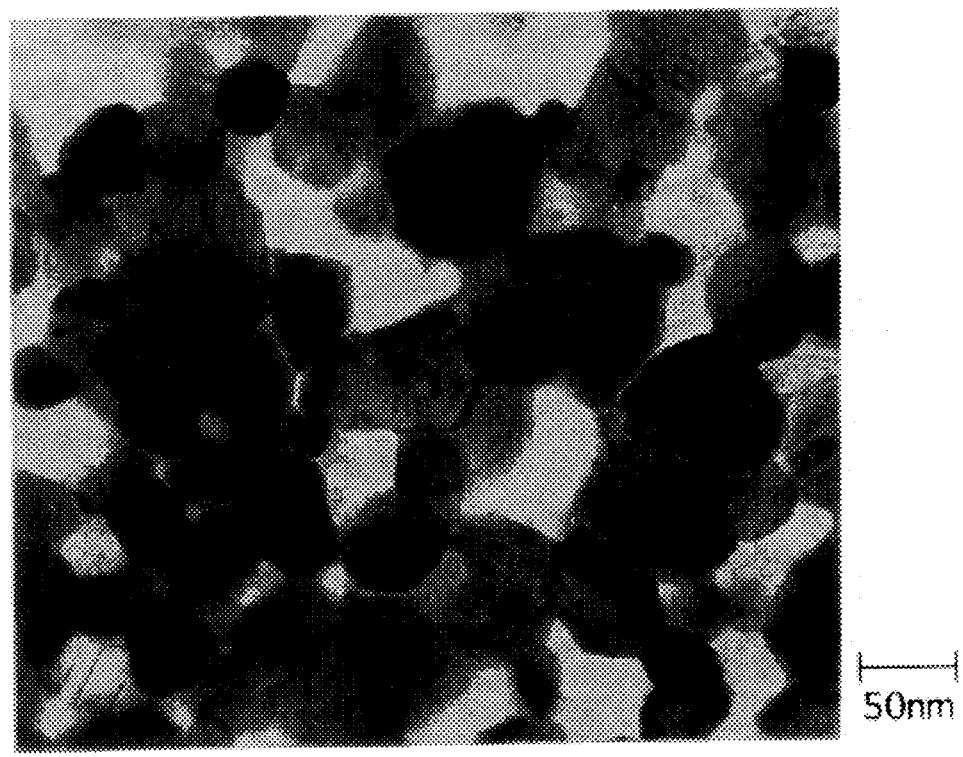
FIG. 5B is a photograph taken by the transmission electron microscope showing grains of a tungsten silicide film of the present invention with the ratio of atoms (Si/W) of 2.64 during deposition.

FIGS. 5A and 5B are photographs of the tungsten silicide film after the heat treatment at 900° C., taken by a transmission electron microscope (TEM). FIG. 5A is a TEM photograph showing a conventional tungsten silicide film where the ratio of atoms (Si/W) is 2.53 during the deposition (the ratio of atoms (Si/W) is 2.26 after the heat treatment). FIG. 5B is a TEM photograph showing the tungsten silicide film according to the present invention where the ratio of atoms (Si/W) is 2.64 during the deposition (the ratio of atoms (Si/W) is 2.36 after the heat treatment).

The tungsten silicide grains after the heat treatment at 900° C. are stoichiometrically classified into two phases, namely, Si grains precipitated during the heat treatment and $WSi_2$ grains. In FIGS. 5A and 5B, areas of dark contrast correspond to $WSi_2$ grains, and areas of bright contrast correspond to Si grains precipitated by the heat treatment. In FIG. 5A showing the conventional tungsten silicide film, the dark areas corresponding to $WSi_2$ grains are clearly identified. On the other hand, in FIG. 5B showing the Si-rich tungsten silicide film of the present invention, the bright areas corresponding to Si grains are clearly identified because of the large amount of precipitated silicon grains.

The inventor of the present invention has found that a diffusion coefficient $D_{WSi2/Si}$ of impurities at the boundaries between $WSi_2$ grains and Si grains is remarkably small as compared with a diffusion coefficient $D_{WSi2/WSi2}$ of impurities in the boundaries between $WSi_2$ grains, as represented by the following Formula (1).

$$D_{WSi2/Si} \ll D_{WSi2/WSi2} \qquad (1)$$

Therefore, the impurities in the tungsten silicide film after the heat treatment mainly diffuse along the boundaries between $WSi_2$ grains rather than between $WSi_2$ grains and Si grains.

Figure 6A:
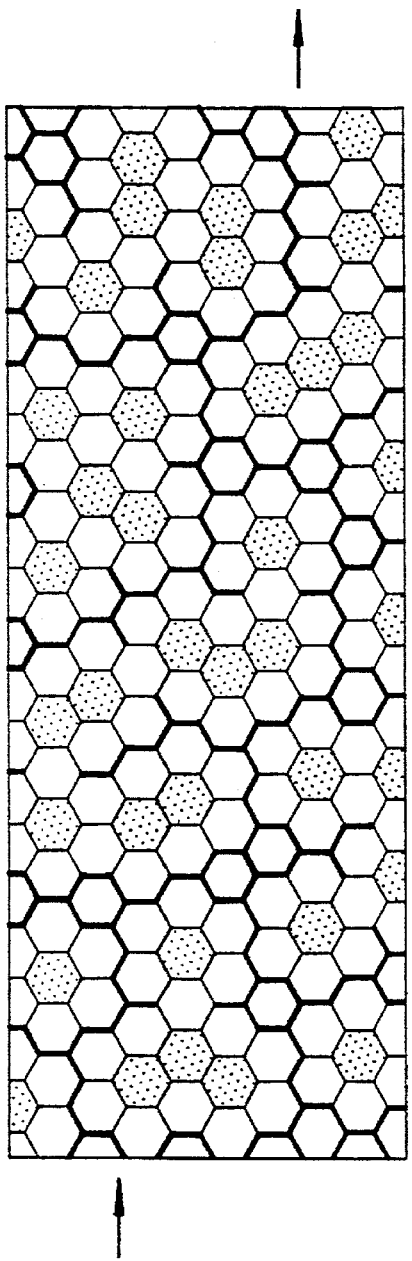
FIG. 6A is a diagram schematically showing a diffusion path of impurities in a conventional tungsten silicide film with the ratio of atoms (Si/W) of 2.53 during deposition.
Figure 6B:
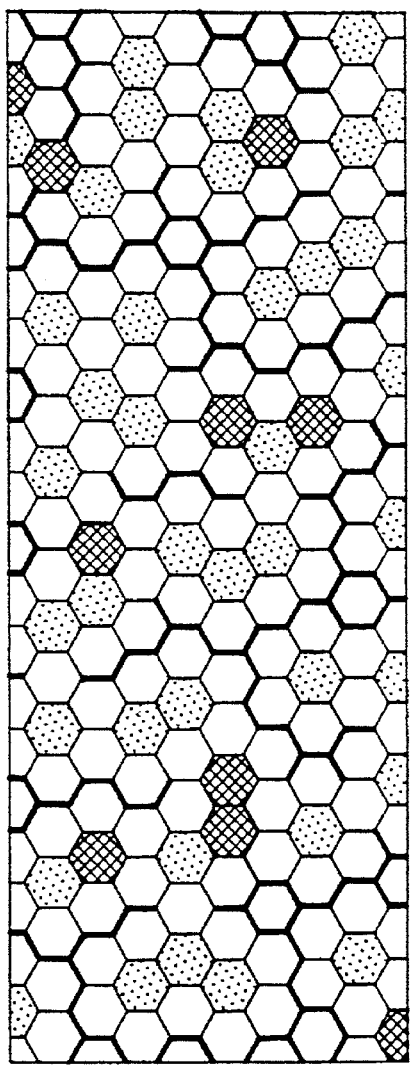
FIG. 6B is a diagram schematically showing a diffusion path of impurities in a tungsten silicide film of the present invention with the ratio of atoms (Si/W) of 2.64 during deposition.

The difference between the present invention and the conventional example in the diffusion paths of impurities in the tungsten silicide films, which has been found based on the above consideration, is schematically shown in FIGS. 6A and 6B. In the tungsten film of the conventional example containing silicon at a low concentration, a continuous diffusion path of impurities can exist along the boundaries between $WSi_2$ grains, as indicated by a bold line with its beginning and end being indicated by the arrows in FIG. 6A. Therefore, the impurities can easily and rapidly diffuse in a lateral direction in the tungsten silicide film along the diffusion path. On the other hand, in the Si-rich tungsten silicide film formed according to the present invention, the increase in the amount of precipitated Si grains in turn increases the number of boundaries between $WSi_2$ grains and Si grains as well as decreases the number of the boundaries between $WSi_2$ grains. As a result, as shown in FIG. 6B, the precipitated Si grains break the continuous lateral diffusion path of the impurities along the $WSi_2$ grain interfaces in the tungsten silicide film. Thus, lateral diffusion of the impurities in the tungsten silicide film according to the present invention is made to be remarkably slow.

Figure 7A:
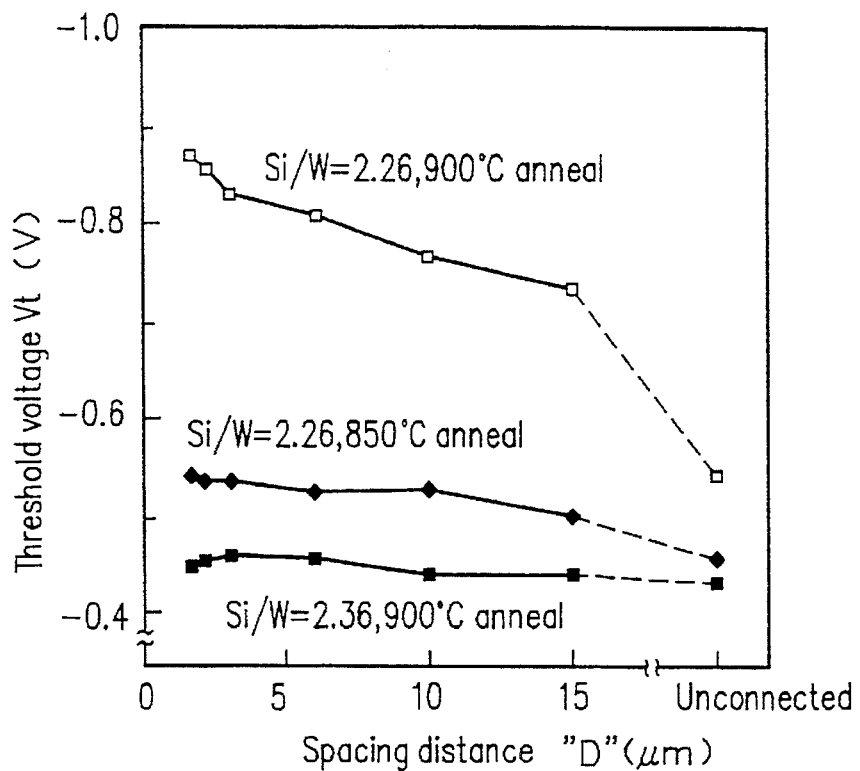
FIG. 7A is a graph showing deviation in a threshold voltage of a p-type MOS transistor.
Figure 7B:
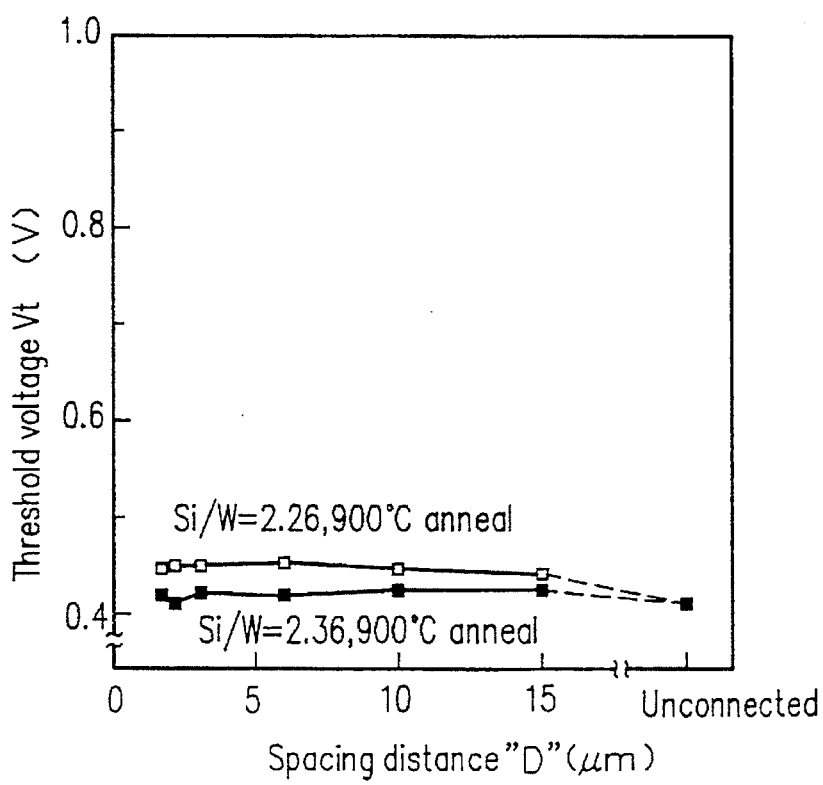
FIG. 7B is a graph showing deviation in a threshold voltage of an n-type MOS transistor.
Figure 8:
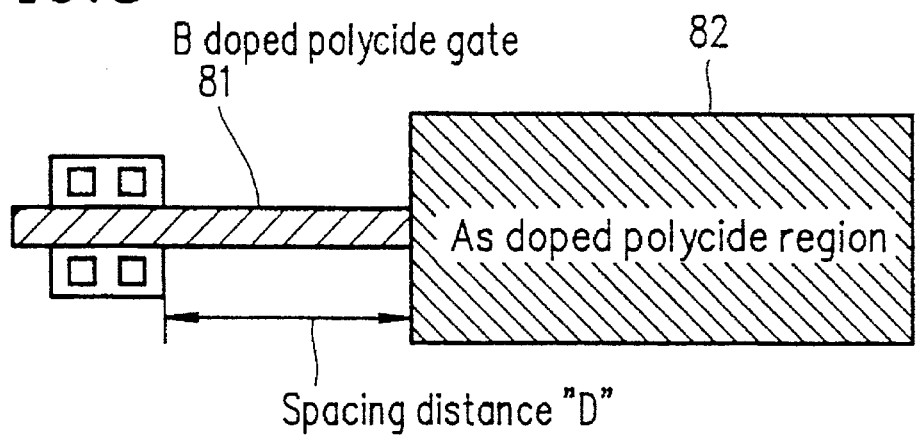
FIG. 8 is a schematic diagram showing a test pattern employed to obtain the graphs of FIGS. 7A and 7B.

The effect of the tungsten silicide film according to the present invention against the threshold voltage deviation of the p-type or n-type MOS transistor will be described with reference to FIGS. 7A to 7B. In order to know the effect for the p-type MOS transistors, a test pattern as shown in FIG. 8, including a polycide gate electrode 81 containing boron as an impurity connected to a large polycide region 82 containing arsenic as an impurity is used. In order to know the effect for the n-type MOS transistors, conductivity types of the impurities contained in the polycide gate electrode 81 and the polycide region 82 are reversed with each other from the ones as shown in FIG. 8. In FIGS. 7A and 7B, the ordinate represents the spacing distance D from the polycide region 82 as shown in FIG. 8, and the abscissa represents the threshold voltage.

In the case of the p-type MOS transistor shown in FIG. 7A, the threshold voltage deviates by about 400 mV at most due to the heat treatment at 900° C. in the conventional example in which the ratio of the number of atoms (Si/W) in the tungsten silicide film is 2.26 after the heat treatment (Si/W=2.53 during the deposition). Even if the thermal treatment is performed at 850° C., the threshold voltage deviation of about 100 mV at most is still present. On the other hand, in the present invention in which the ratio of the number of atoms (Si/W) in the tungsten silicide film is 2.36 after the heat treatment (Si/W=2.64 during the deposition), the threshold voltage deviates by 20 mV or less, even if the heat treatment is performed at 900° C.

In the case of the n-type MOS transistor, the threshold voltage conventionally deviates only within the narrow range of 50 mV, as shown in FIG. 7B. In the n-type MOS transistor including the above tungsten silicide film of the present invention as a gate electrode, the threshold voltage deviation after the heat treatment is suppressed within the narrower range, i.e., 20 mV.

As described above, the first example of the invention relates to the semiconductor device 100 which has the p-channel and n-channel MOS transistors and polycide gate electrodes, using the polycide films including the p$^+$-type or n$^+$-type polysilicon film, as gate electrodes of the respective transistors. In such a semiconductor device 100, the excessive silicon grains in the metal silicide film are precipitated in the silicide grain boundaries. Thus, the boundaries between WSi$_2$ grains in the metal silicide film along which the impurities diffuse, becomes discontinuous. With this discontinuous path, the impurities do not laterally diffuse even after the heat treatment is performed. Therefore, the threshold voltage deviation can be suppressed in the p-channel MOS transistor as well as in the n-channel transistor.

Although it is described in the above that the threshold voltage deviation can be suppressed within 20 mV according to the present invention, the typical deviation within 10%, or even within 5%, of the design value does not introduce a problem.

EXAMPLE 2

Figure 9:
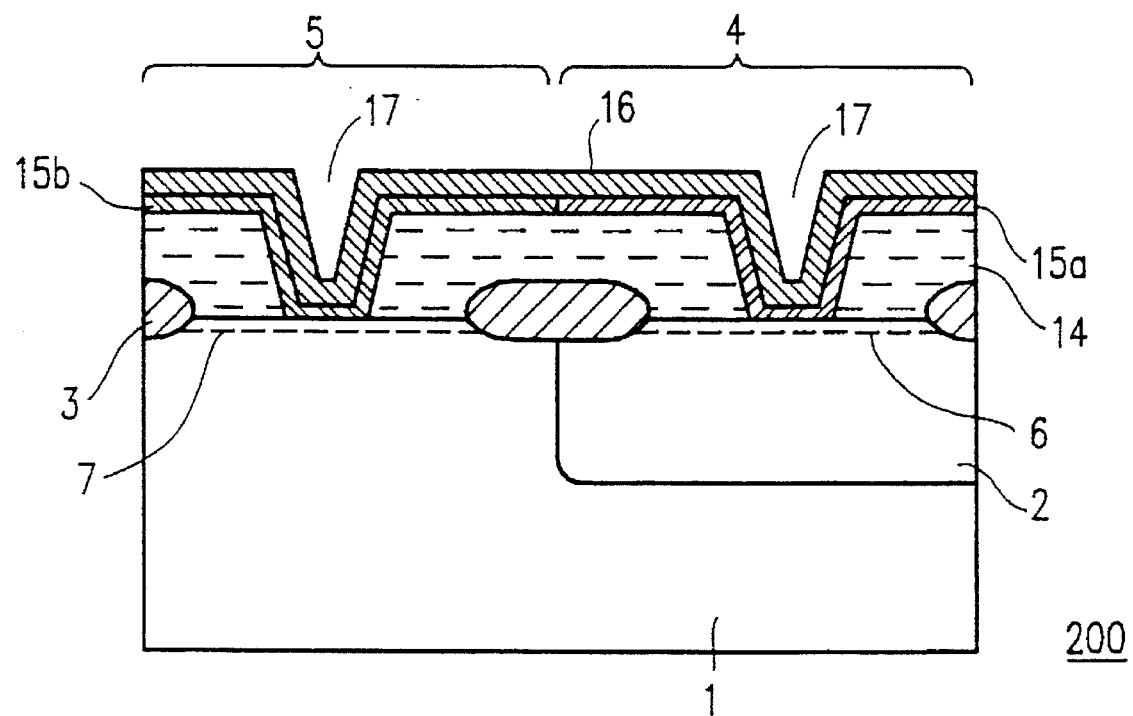
FIG. 9 is a cross-sectional structural view of a main portion of a semiconductor device of a second example according to the present invention.
Figure 10A:
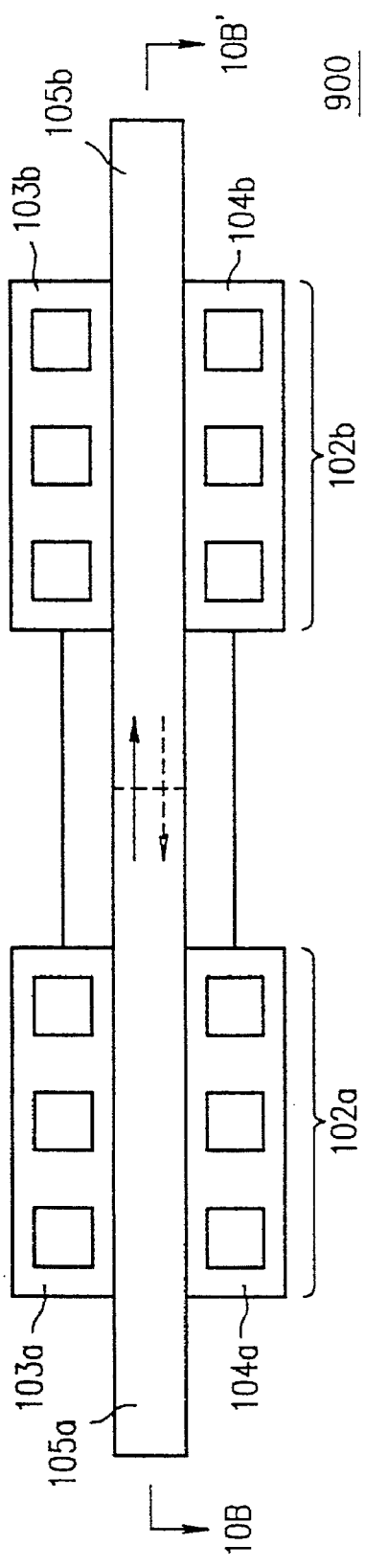
FIGS. 10A and 10B are diagrams schematically illustrating the problem in a conventional metal silicide film, FIG. 10A being a plan view showing a typical structure of a semiconductor device.
Figure 10B:
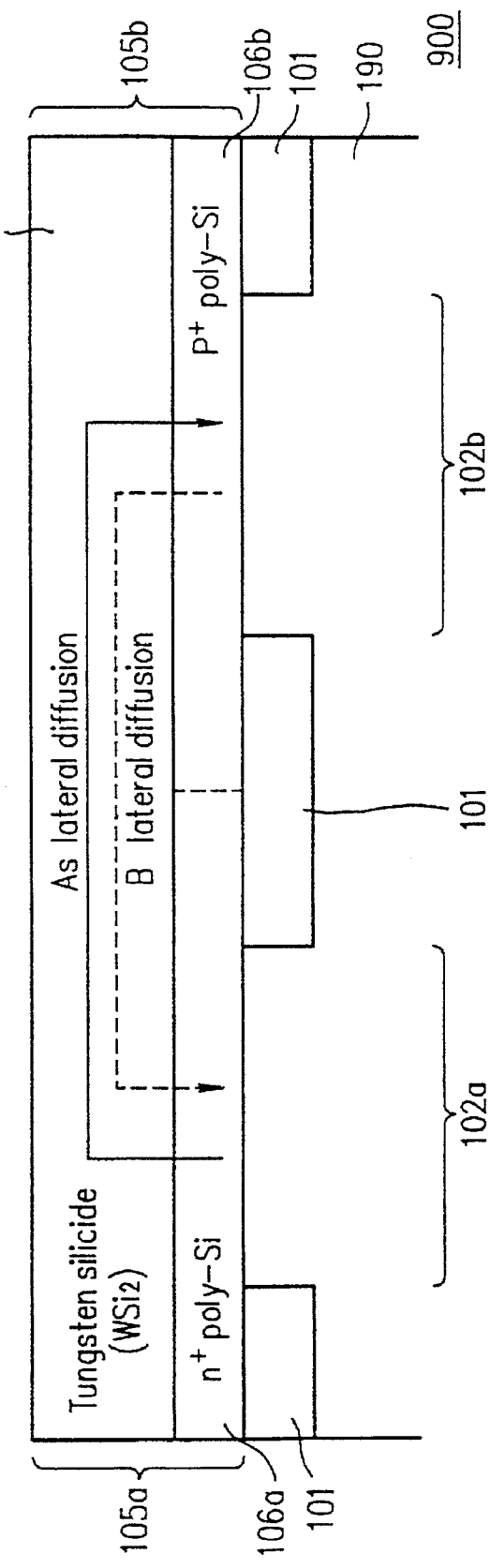

As a second example of the present invention, a semiconductor device in which a polycide film having the feature of the present invention is used for interconnection as a polycide wiring is explained below. FIG. 9 is a cross-sectional structural view of a main portion of the semiconductor device 200 of this example. In FIG. 9, components having the same functions as those of the semiconductor device 100 of the first example described with reference to FIG. 1 are indicated by the same reference numerals and the detailed description thereof is herein omitted.

The method for fabricating the above semiconductor device 200 will be described. Since the steps for forming the n-well 2, the isolation regions 3, the p$^+$-type diffusion region 6 and the n$^+$-type diffusion region 7 in the p-type silicon substrate 1 are similar as those in the first example, the description thereof is herein omitted.

After an interlevel insulating film 14 is formed on the entire surface of the semiconductor device 200, contact holes 17 are formed through the interlevel insulating film 14. A native oxide film formed on the surface is removed by dip etching using an aqueous solution containing hydrofluoric acid. After this treatment, a p$^+$-type polysilicon film 15a and an n$^+$-type polysilicon film 15b are formed by the similar method as employed when the p$^+$-type polysilicon film 9a and the n$^+$-type polysilicon film 9b are formed in the first example. Then, a tungsten silicide film 16 is deposited on the polysilicon films 15a and 15b by the similar method as employed when the tungsten silicide film 12 is formed in the first example.

As described above, in this example, the polycide film formed according to the present invention is used as a polycide interconnection. Also in such a case, since the excessive silicon grains in the tungsten silicide film are present at the silicide grain boundaries in the metal silicide film, the boundaries between the WSi$_2$ grains in the metal silicide film along which the impurities diffuse become discontinuous. Therefore, the impurities do not laterally diffuse even when the heat treatment is performed. As a result, even when the p$^+$-diffusion region 6 and the n$^+$-diffusion region 7 are connected to each other through the polycide film of the present invention, the contact resistance deviation can be sufficiently suppressed at either the contact portion between the n$^+$-type polysilicon film 15b and the n$^+$-diffusion region 7 or the contact portion between the p$^+$-polysilicon film 15a and the p$^+$-diffusion region 6.

Typically, a contact resistance deviation within 20% of the design value does not introduce a problem.

The sheet resistance increases by about 20% with the increase in the amount of silicon contained in the metal silicide film as compared with the conventional example, resulting in the increase in wiring resistance. However, such an increase is within the permitted limit.

In the first and second examples described above, the present invention is described, taking the two-layer polycide structure including the metal silicide film and the polysilicon film as an example. However, the application of the present invention is not limited to such a two-layer polycide structure. For example, another polysilicon film for preventing boron from segregating can be provided between the metal silicide film and the insulating film provided on the metal silicide film. Alternatively, in order to prevent boron from decreasing, the entire metal silicide film may be doped with boron. Furthermore, the effect similar to that described above can be obtained with the structure where the metal silicide film is directly connected with a p$^+$-region and a n$^+$-region provided in the substrate, such as the silicide interconnection.

A film other than an oxide film, for example, a nitride oxide film, can be used for the gate oxide film. Furthermore, although the n$^+$-polysilicon film and the p$^+$-polysilicon film are formed by employing the ion implantation, they may be formed by thermal diffusion.

Although the tungsten silicide film is used as the metal silicide film, the effect similar to that described above can be obtained by using other metal silicide films such as a titanium silicide film or a molybdenum silicide film. Alternatively, although arsenic is used as the n-type impurity in the examples, the effect similar to that described above can be obtained by using phosphorus.

In the first example described above, the gate electrodes of the p-channel MOS transistor and the n-channel MOS transistor as well as the interconnection for connecting them are integrally formed by the continuous polycide film. In the second example, the p$^+$-type diffusion region and the n$^+$-type diffusion region are connected with each other through the continuous polycide film. In addition to the above structures, it is possible to connect the other portions included in the semiconductor device, such as a diffusion layer and a gate electrode, through the metal silicide film according to the present invention.

The metal silicide film of the present invention contains excessive silicon grains. As described above with reference to the second example, the specific resistance increases with increase in Si of the composition of the metal silicide film. Thus, it is desirable that the composition of silicon in the metal silicide film is low as long as the deterioration of electrical characteristics of the semiconductor device due to the lateral diffusion of impurities is suppressed. For example, if the ratio of the number of atoms (Si/W) after the heat treatment is 3.0 or more, the specific resistance remarkably increases. As a result, the advantage in using the metal silicide film instead of a polysilicon film having a high specific resistance is lost. However, in the case where the main purpose is to electrically connect the n-type polysilicon film and the p-type polysilicon film without strong need of lowering the resistance, the metal silicide film is allowed to have the same specific resistance as that of the polysilicon film. Thus, the rate of silicon contained in the metal silicide film can be increased within the range where the ratio of the number of atoms (Si/W) after the heat treatment is 4.0 or less.

As described above, excessive silicon contained in a metal silicide film is precipitated in the silicide grain boundaries, thereby breaking the continuous interfaces between $WSi_2$ grains in the silicide grain boundaries along which impurities diffuse. As a result, the impurities do not laterally diffuse even after the heat treatment. Therefore, even if the semiconductor device using the metal silicide films according to the present invention as a polycide gate electrodes of MOSFETs is subjected to the heat treatment, the threshold voltage does not deviate. Furthermore, even if the metal silicide film is used as an interconnection for connecting the $n^+$-diffusion region and the $p^+$-diffusion region, the increase in wiring resistance due to the increase in the Si content is within the permitted limit and therefore the contact resistance deviation can be suppressed.

Furthermore, electrical conduction between the $p^+$-polysilicon film and the $n^+$-polysilicon film can be realized without using a contact which requires an additional area. Since the effect is maintained even if the semiconductor device is subjected to the heat treatment at 900° C., planarizing treatment using a BPSG film can be carried out. Although a long distance between the $p^+$-region and the $n^+$-region is conventionally needed to prevent the influence of the lateral diffusion of the impurities, the construction of the present invention makes it possible to shorten the distance. As a result, the construction of the present invention greatly contributes to reduction in size of an integrated circuit device.

In the case where the metal silicide film is a tungsten silicide film, setting the ratio of Si atoms to tungsten atoms (Si/W) at a value within the range of 2.36 to 4.0, preferably, within the range of 2.36 to 3.0, makes it possible to obtain the above effect without being affected by the increase in the specific resistance of the metal silicide film due to the excessive silicon.

The present invention is applicable to a polycide gate of a p-channel or n-channel MOS transistor as well as a polycide interconnection thereof. The excessive silicon grains are contained at a predetermined value or less in the metal silicide film, which are sufficient to keep the threshold voltage deviation for the application to the polycide gate or the contact resistance deviation for the application to the polycide interconnection, thereby realizing the semiconductor device with excellent electrical characteristics.

Depositing another polysilicon film for preventing segregation of boron on the metal silicide film or having the entire metal silicide film uniformly doped with boron further make it possible to suppress the lateral diffusion of impurities.

For the deposition of the metal silicide film, a chemical vapor deposition method or a sputtering method, which are generally employed in the semiconductor technology, can be used. In the case where the chemical vapor deposition method is used in particular, the fabrication process can be prevented from becoming complicated by successively depositing the metal silicide film and the polysilicon film in the same vacuum chamber.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device comprising a metal silicide film for electrically connecting a first silicon region containing a p-type impurity with a second silicon region containing an n-type impurity, the method comprising the step of depositing the metal silicide film so as to contain excessive silicon, wherein the excessive silicon is precipitated in silicide grain boundaries in the metal silicide film, thereby making a diffusion path of impurities along the silicide grain boundaries discontinuous.

2. A method for fabricating a semiconductor device according to claim 1, wherein the metal silicide film is a tungsten silicide film, the tungsten silicide film having a ratio of silicon atoms to tungsten atoms (Si/W) within a range of 2.36 to 4.0.

3. A method for fabricating a semiconductor device according to claim 2, wherein the ratio of silicon atoms to tungsten atoms (Si/W) is within a range of 2.36 to 3.0.

4. A method for fabricating a semiconductor device according to claim 1, wherein the first silicon region is a first polysilicon film doped with the p-type impurity in a p-type polycide gate electrode of a p-channel MOS transistor, the second silicon region is a second polysilicon film doped with the n-type impurity in an n-type polycide gate of an n-channel MOS transistor, and the metal silicide film is deposited on the first and second polysilicon films so as to electrically connect the first and second polysilicon films.

5. A method for fabricating a semiconductor device according to claim 4, wherein the excessive silicon is sufficiently excessive to suppress a threshold voltage deviation in each of the p-type and n-type polycide gate electrodes within a range of 20 mV.

6. A method for fabricating a semiconductor device according to claim 4, wherein the excessive silicon is sufficiently excessive to suppress a threshold voltage deviation in each of the p-type and n-type polycide gate electrodes within 10% of a design value.

7. A method for fabricating a semiconductor device according to claim 4, wherein the step of depositing the metal silicide film employs a chemical vapor deposition method, and the metal silicide film and the first and second polysilicon films are successively deposited in the same vacuum chamber.

8. A method for fabricating a semiconductor device according to claim 4, the method further including the step of depositing a third polysilicon film for preventing segregation of boron on the metal silicide film, wherein the step of depositing the metal silicide film employs a chemical vapor deposition method, and the metal silicide film and the first, second and third polysilicon films are successively deposited in the same vacuum chamber.

9. A method for fabricating a semiconductor device according to claim 1, wherein the first silicon region is a first polysilicon film doped with the p-type impurity being in contact with a $p^+$-type diffusion region doped with the p-type impurity of the p-channel MOS transistor, the second silicon region is a second polysilicon film doped with the n-type impurity being in contact with an $n^+$-type diffusion region doped with the n-type impurity of the n-channel MOS transistor, and the metal silicide film is deposited on the first and second polysilicon films so as to electrically connect the first and second polysilicon films.

10. A method for fabricating a semiconductor device according to claim 9, wherein the excessive silicon is sufficiently excessive to suppress deviation of a contact resistance between the $p^+$-type diffusion region and the first polysilicon film and deviation of a contact resistance between the $n^+$-type diffusion region and the second polysilicon film within 20% of a design value, respectively.

11. A method for fabricating a semiconductor device according to claim 9, wherein the step of depositing the metal silicide film employs a chemical vapor deposition method, and the metal silicide film and the first and second polysilicon films are successively deposited in the same vacuum chamber.

12. A method for fabricating a semiconductor device according to claim 9, the method further including the step of depositing a third polysilicon film for preventing segregation of boron on the metal silicide film, wherein the step of depositing the metal silicide film employs a chemical vapor deposition method, and the metal silicide film and the first, second and third polysilicon films are successively deposited in the same vacuum chamber.

13. A method for fabricating a semiconductor device according to claim 1, further comprising the step of depositing a third silicon film for preventing segregation of boron on the metal silicide film.

14. A method for fabricating a semiconductor device according to claim 1, wherein the step of depositing the metal silicide film employs a chemical vapor deposition method.

15. A method for fabricating a semiconductor device according to claim 1, wherein the step of depositing the metal silicide film employs a sputtering method.

* * * * *

UNITED STATES PATENT AND TRADEMARK OFFICE
CERTIFICATE OF CORRECTION

PATENT NO. : 5,652,183
DATED : July 29, 1997
INVENTOR(S) : Fujii

It is certified that error appears in the above-identified patent and that said Letters Patent is hereby corrected as shown below:

On the cover page, item [56] References Cited, Other Publications, delete "C.L. Chu et al., "Technology Limitations for $N^{30}/P^{30}$ Polycide Gate CMOS due to Lateral Dopant Diffusion in Silicide/Polysilicon Layers", *IEEE Electron Device Letters,* vol. 12, No. 12, Dec. 1991." and insert therefor -- C.L. Chu et al., "Technology Limitations for $N^+/P^+$ Polycide Gate CMOS due to Lateral Dopant Diffusion in Silicide/Polysilicon Layers", *IEEE Electron Device Letters,* vol. 12, No. 12, Dec. 1991.--.

On the cover page, item [56] References Cited, Other Publications, delete "T. Fujii et al., Dual ($n^{30}/p^{30}$) Polycide Gate Technology using Si-rich WSix to Exterminate Lateral Dopant Diffusion", *1994 Symposium on VLSI Technology Digest of Technical Papers,* pp. 117-118, 7-9 Jun. 1994." and insert therefor -- T. Fujii et al., Dual ($n^+/p^+$) Polycide Gate Technology using Si-rich WSix to Exterminate Lateral Dopant Diffusion", *1994 Symposium on VLSI Technology Digest of Technical Papers,* pp. 117-118, 7-9 Jun. 1994.--.

UNITED STATES PATENT AND TRADEMARK OFFICE
CERTIFICATE OF CORRECTION

PATENT NO. : 5,652,183
DATED : July 29, 1997
INVENTOR(S) : Fujii

It is certified that error appears in the above-identified patent and that said Letters Patent is hereby corrected as shown below:

On the cover page, item [56] References Cited, Other Publications, delete "L.C. Parrillo et al., "A Fine-Line CMOS Technology That Uses $P^{30}$-Polysilicon/Silicide Gates for NMOS and PMOS Devices", *IEEE IEDM Technical Digests*, pp. 418-422, Dec. 1984." and insert therefor -- L.C. Parrillo et al., "A Fine-Line CMOS Technology That Uses $P^+$-Polysilicon/Silicide Gates for NMOS and PMOS Devices", *IEEE IEDM Technical Digests*, pp. 418-422, Dec. 1984.--.

At column 7, line 60, "$Wsi_2$" should read --$WSi_2$--.

At column 7, line 67, "$Wsi_2$" should read --$WSi_2$--.

At column 8, line 2, "$D_{WSi2/Wsi2}$" should read --$D_{WSi2/WSi2}$--.

Signed and Sealed this

Twentieth Day of January, 1998

BRUCE LEHMAN

Attest:

Attesting Officer

Commissioner of Patents and Trademarks